(12) United States Patent
Zhang et al.

(10) Patent No.: US 11,527,412 B2
(45) Date of Patent: Dec. 13, 2022

(54) METHOD FOR INCREASING PHOTORESIST ETCH SELECTIVITY TO ENABLE HIGH ENERGY HOT IMPLANT IN SIC DEVICES

(71) Applicant: Applied Materials, Inc., Santa Clara, CA (US)

(72) Inventors: Qintao Zhang, Mt Kisco, NY (US); Samphy Hong, Saratoga Springs, NY (US); David J. Lee, Poughkeepsie, NY (US); Felix Levitov, Ballston Lake, NY (US); Lei Zhong, Austin, TX (US); Wei Zou, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 253 days.

(21) Appl. No.: 17/113,073

(22) Filed: Dec. 6, 2020

(65) Prior Publication Data

US 2022/0044939 A1   Feb. 10, 2022

Related U.S. Application Data

(60) Provisional application No. 63/063,298, filed on Aug. 9, 2020.

(51) Int. Cl.
| | |
|---|---|
| *H01L 21/311* | (2006.01) |
| *H01J 37/317* | (2006.01) |
| *H01L 21/3115* | (2006.01) |

(52) U.S. Cl.
CPC .... *H01L 21/31116* (2013.01); *H01J 37/3171* (2013.01); *H01L 21/31144* (2013.01); *H01L 21/31155* (2013.01); *H01J 2237/3341* (2013.01)

(58) Field of Classification Search
CPC ......... H01L 21/31116; H01L 21/31144; H01L 21/31155; H01J 37/3171; H01J 2237/3341
See application file for complete search history.

(56) References Cited

U.S. PATENT DOCUMENTS

| | | | |
|---|---|---|---|
| 11,158,507 B2* | 10/2021 | Venkatasubramanian | .................. H01L 21/02115 |
| 2007/0254452 A1* | 11/2007 | Merlin | ................ H01L 21/3081 430/5 |

(Continued)

FOREIGN PATENT DOCUMENTS

| | | | | |
|---|---|---|---|---|
| WO | WO-2015105651 A1 * | 7/2015 | ......... | H01L 21/3086 |

OTHER PUBLICATIONS

Heguang Shi, Zhou Fang, Dongxu Yang, "Mechanism study of ion implantation on photoresist shrinkage," Proc. SPIE 10586, Advances in Patterning Materials and Processes XXXV, 105861H (Mar. 13, 2018); https://doi.org/10.1117/12.2297367.*

*Primary Examiner* — Yara B Green
*Assistant Examiner* — Fakeha Sehar
(74) *Attorney, Agent, or Firm* — KDB Firm PLLC

(57) ABSTRACT

A method for performing an ion implantation process including providing a hardmask layer disposed atop a substrate, providing a photoresist layer disposed atop the hardmask layer and defining a pattern exposing a portion of the hardmask layer, performing a room temperature ion implantation process wherein an ion beam formed of an ionized first dopant species is directed onto the exposed portion of the hardmask layer to make the exposed portion more susceptible to ion etching or wet etching, performing an etching process wherein the exposed portion of the hardmask layer is etched away to expose an underlying portion of the substrate, and performing a high energy, hot ion implantation process wherein an ion beam formed of a ionized second dopant species is directed onto the exposed portion of the substrate.

20 Claims, 2 Drawing Sheets

(56) References Cited

U.S. PATENT DOCUMENTS

| | | | |
|---|---|---|---|
| 2009/0166733 A1* | 7/2009 | Lee | H01L 29/66727 438/270 |
| 2013/0048014 A1* | 2/2013 | Shaviv | H01J 37/32449 134/1.1 |
| 2013/0084685 A1* | 4/2013 | Fang | H01L 21/266 257/E21.409 |
| 2020/0105879 A1* | 4/2020 | Hawkins | H01L 29/0634 |
| 2021/0225645 A1* | 7/2021 | Gendron-Hansen | H01L 21/02274 |

* cited by examiner

METHOD FOR INCREASING PHOTORESIST ETCH SELECTIVITY TO ENABLE HIGH ENERGY HOT IMPLANT IN SIC DEVICES

CROSS-REFERENCE TO RELATED APPLICATION

This application claims priority to U.S. Provisional Patent Application No. 63/063,298 filed on Aug. 9, 2020, entitled "METHOD FOR INCREASING PHOTORESIST ETCH SELECTIVITY TO ENABLE HIGH ENERGY HOT IMPLANT IN SIC DEVICES," and incorporated by reference herein in its entirety.

FIELD OF THE DISCLOSURE

Embodiments of the present disclosure relate to the field of ion implantation devices and methods, and more particularly to a method of enhancing photoresist etch selectivity to facilitate high energy, hot implantation processes for the fabrication of modern SiC power devices.

BACKGROUND OF THE DISCLOSURE

The manufacture of modern silicon carbide (SiC) power devices (e.g., MOSFETs and the like) often includes high energy, hot ion implantation processes (e.g., 1000 KeV at >500° Celsius) for achieving certain device characteristics. For example, high energy, hot ion implantation processes may be used to thin SiC n-drift regions to reduce drift region resistance and improve drive current, as well as to increase the thickness of p-wells to prevent punch-through upon a high voltage drop on a p-well.

Hardmasks are typically employed in high energy, hot ion implantation processes to mask areas of an underlying substrate to be shielded during implantation (photoresists generally cannot be used for such masking because they cannot withstand the high temperatures required for hot implantation processes). Hardmasks used in such processes are generally quite thick to ensure effective shielding from implantation. This, in-turn, necessitates the use of a relatively thick photoresist when a hardmask is etched to achieve a desired mask pattern. This is due to poor etch selectively between the material of the photoresist (typically an organic, light-sensitive material) and the material of the hardmask (e.g., silicon dioxide). Since the photoresist and the hardmask may be etched at similar rates during an etching process, the photoresist needs to be made sufficiently thick so it will not be completely etched away before etching of the hardmask is complete.

Problematically, many conventional photolithography systems are not capable of accommodating the thick photoresists necessary for facilitating hot, high energy ion implantation. One solution to this problem is to employ a hardmask material relatively more susceptible to etching and thus etches faster than the material of a photoresist, allowing a relatively thinner photoresist to be used. Such materials are generally associated with a higher cost.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A method for performing an ion implantation process in accordance with an exemplary embodiment of the present disclosure may include providing a substrate to be implanted, providing a hardmask layer disposed atop the substrate, and providing a photoresist layer disposed atop the hardmask layer, the photoresist layer defining a trench exposing a portion of the hardmask layer. The method may further include performing a room temperature ion implantation process wherein an ion beam formed of an ionized first dopant species is directed onto the photoresist layer and the exposed portion of the hardmask layer, the first dopant species selected to make the exposed portion of the hardmask layer more susceptible etching, performing an etching process wherein the exposed portion of the hardmask layer is etched away to expose an underlying portion of the substrate, and performing a high energy, hot ion implantation process wherein the photoresist layer is removed, and wherein an ion beam formed of a ionized second dopant species is directed onto the hardmask layer and the exposed portion of the substrate to implant the exposed portion of the substrate with the second dopant species.

Another method for performing an ion implantation process in accordance with an exemplary embodiment of the present disclosure may include providing a substrate to be implanted, the substrate including an n-drift layer and a silicon nitride layer disposed atop the n-drift layer, providing a hardmask layer disposed atop the substrate, the hardmask layer having a thickness in a range of 0.5 um to 3 um, and providing a photoresist layer disposed atop the hardmask layer, the photoresist layer defining a trench exposing a portion of the hardmask layer, the photoresist layer having a thickness in a range of 1 um to 3 um. The method may further include performing a first ion implantation process wherein an ion beam formed of an ionized first dopant species is directed onto the photoresist layer and the exposed portion of the hardmask layer, the first dopant species selected to make the exposed portion of the hardmask layer more susceptible to etching, performing at least one of an ion etching process and a wet etching process wherein the exposed portion of the hardmask layer is etched away to expose an underlying portion of the substrate, and performing a high energy, hot, second ion implantation process wherein the photoresist layer is removed, and wherein an ion beam formed of a ionized second dopant species is directed onto the hardmask layer and the exposed portion of the substrate to implant the exposed portion of the substrate with the second dopant species.

BRIEF DESCRIPTION OF THE DRAWINGS

By way of example, various embodiments of the disclosed techniques will now be described, with reference to the accompanying drawings, wherein.

DETAILED DESCRIPTION

Figure 1A:
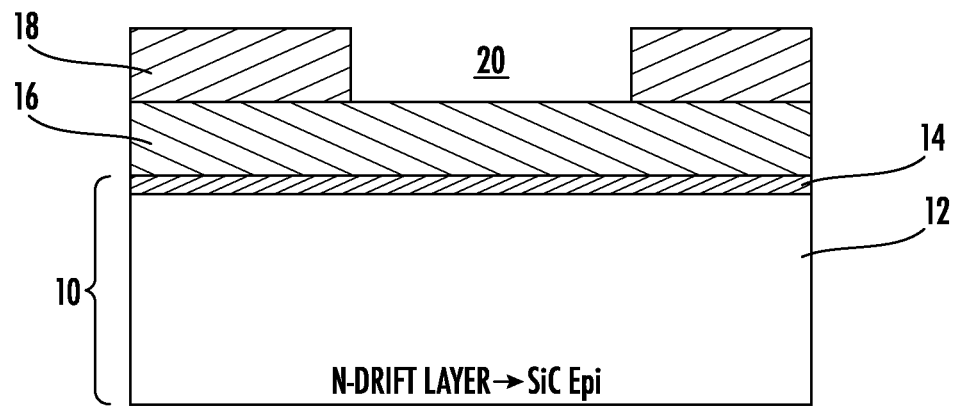
FIGS. 1A-1D are a series of cross-sectional views illustrating a method of performing a high energy, hot ion implantation process in accordance with the present disclosure.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Figure 1B:
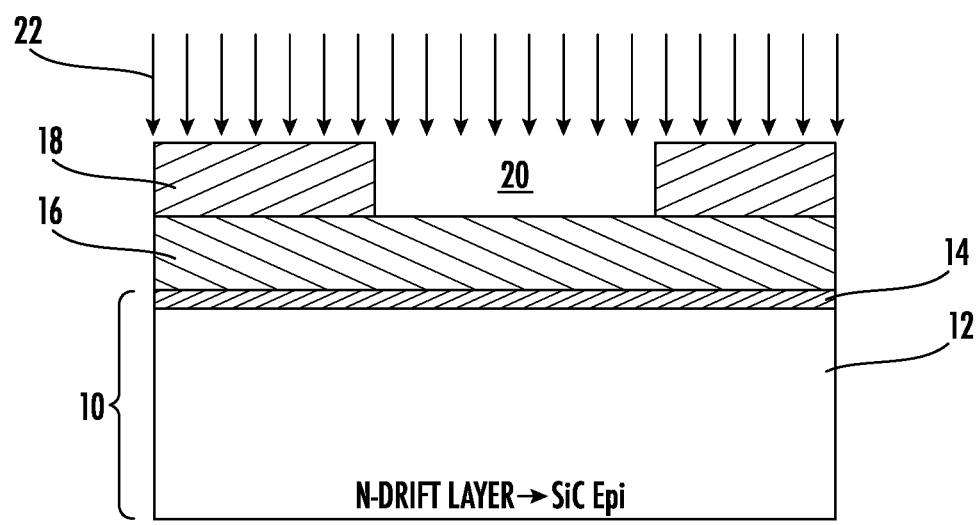
Figure 1C:
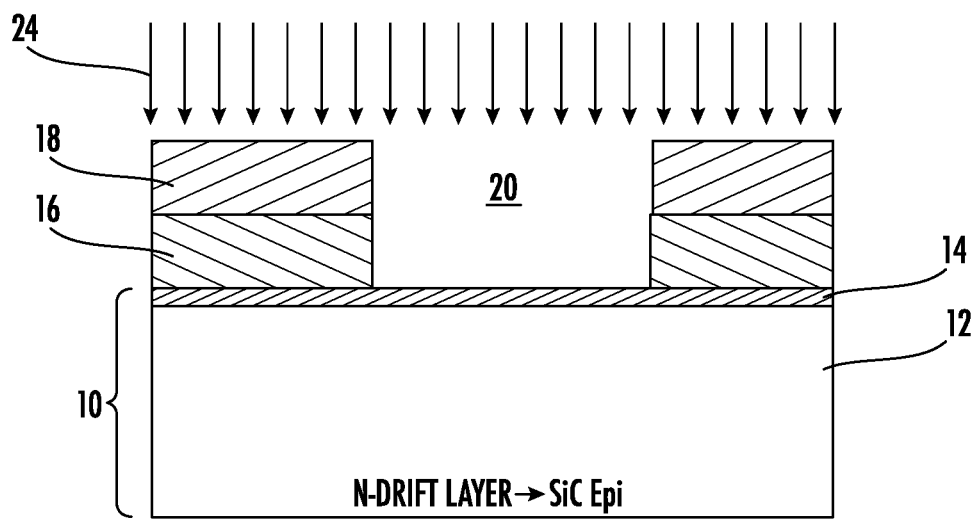

Referring to FIGS. 1A-1C, a series of views illustrating an exemplary method for performing a high energy, hot ion implantation process in accordance with the present disclosure are shown. The illustrated process may be employed in the fabrication of modern silicon carbide (SiC) power devices (e.g., MOSFETs and the like), such as for thinning SiC n-drift regions to reduce drift region resistance and improve drive current, and/or for increasing the thickness of p-wells to prevent punch-through upon a high voltage drop on a p-well, for example. The present disclosure is not limited in this regard.

As illustrated in FIG. 1A, a substrate 10 may be provided and may form a portion of a SiC power device being manufactured. In various embodiments, the substrate 10 may include a plurality of layers, such as an n-drift layer 12 and a silicon nitride (SiN) layer 14 disposed atop the n-drift layer 12. The present disclosure is not limited in this regard. A hardmask layer 16 may be disposed atop the substrate 10 (e.g., on the SiN layer 14), and photoresist layer 18 may be disposed atop the hardmask layer 16. The photoresist layer 18 may define a pattern to be etched into the underlying hardmask layer 16. In the present example, the pattern defined by the photoresist layer 18 may include a trench 20.

The hardmask layer 16 may be formed of any conventional hardmask material, including, and not limited to, silicon dioxide (SiO$_2$), amorphous carbon, etc., and may be relatively thick compared to hardmasks employed in conventional ion implantation processes. For example, the hardmask layer 16 may have a thickness in a range of 0.5 um to 3 um. This increased thickness relative to conventional hardmasks may ensure effective masking for high energy, hot ion implantation processes (e.g., >1000 KeV at >500° Celsius) as further described below. The photoresist layer 18 may be formed of any suitable, light-sensitive organic material familiar to those of ordinary skill in the art and may have a conventional thickness. For example, the photoresist layer 18 may have a thickness in a range of 1 um to 3 um. The present disclosure is not limited in this regard.

Referring to FIG. 1B, a room temperature (e.g., 18-20° Celsius) ion implantation process may be performed, wherein an ion beam 22 formed of an ionized dopant species may be directed onto the photoresist layer 18 and onto the portion of the hardmask layer 16 exposed by the trench 20 at an angle perpendicular to the upper surface of the photoresist layer 18. The dopant species transmitted in the ion beam 22 may be selected to make the exposed portion of the hardmask layer 16 more susceptible to etching (e.g., ion etching or wet etching) relative to the masked portions of the hardmask layer 16. More specifically, the implanted portion of the hardmask layer 16 may become more susceptible to etching than the photoresist layer 18. The photoresist layer 18 may be generally unaffected by the ion implantation process. In various examples, the dopant species may be one or more of carbon, boron, oxygen, nitrogen, phosphorous, fluorine, etc. The present disclosure is not limited in this regard.

Referring to FIG. 1C, an etching process (e.g., a reactive-ion etching process or hydrofluoric acid etching process) may be performed to etch the exposed portion of the hardmask layer 16 while preserving the photoresist layer 18. For example, an ion beam 24 formed of reactive plasma ions may be directed onto the photoresist layer 18, and onto the portion of the hardmask layer 16 exposed by the trench 20, at an angle perpendicular to the upper surface of the photoresist layer 18. Owing to the above-described implantation process (illustrated in FIG. 1B), wherein the exposed portion of the hardmask layer 16 is made more susceptible to etching relative to the photoresist layer 18, the exposed portion of the hardmask layer 16 may be etched at a faster rate than the photoresist layer 18. Thus, the exposed portion of the hardmask layer 16 may be completely etched (e.g. etched away to expose the underlying SiN layer 14 of the substrate 10) while the photoresist layer 18 is generally preserved or minimally etched, despite the hardmask layer 16 being relatively thick and the photoresist layer 18 being of conventional thickness.

Figure 1D:
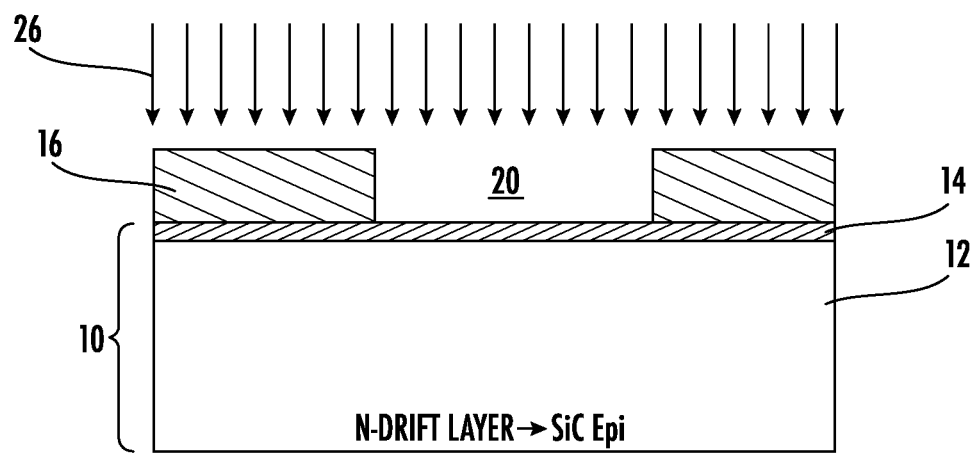

Referring to FIG. 1D, a high energy, hot ion implantation process may be performed, wherein an ion beam 26 formed of an ionized dopant species may be directed onto the hardmask layer 16 and into the trench 20. In a non-limiting example, the dopant species may be aluminum and the implantation may be performed at an energy of greater than 1000 KeV and at a temperature of greater than 500° Celsius. The present disclosure is not limited in the regard. Thus, the substrate 10 may be implanted in a desired manner and the photoresist layer 18 may be entirely removed while the relatively thick hardmask layer 16 effectively shields the masked portions of the substrate 10 from the high energy implant.

The above-described method provides several advantages in the art. For example, the method illustrated in FIGS. 1A-1D facilitates the implementation of high energy, hot ion implantation processes using conventional photolithography systems not capable of accommodating thick photoresists. As a further advantage, the method illustrated in FIGS. 1A-1D facilitates the implementation of high energy, hot ion implantation processes using hardmasks formed of conventional hardmask materials.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method for performing an ion implantation process, comprising:
   providing a substrate to be implanted;
   providing a hardmask layer disposed atop the substrate;
   providing a photoresist layer disposed atop the hardmask layer, the photoresist layer defining a pattern exposing a portion of the hardmask layer;
   performing a first ion implantation process wherein an ion beam formed of an ionized first dopant species is directed onto the photoresist layer and the exposed portion of the hardmask layer, the first dopant species selected to make the exposed portion of the hardmask layer more susceptible to etching;

performing an etching process wherein the exposed portion of the hardmask layer is etched away to expose an underlying portion of the substrate; and performing a high energy, hot, second ion implantation process wherein the photoresist layer is removed, and wherein an ion beam formed of a ionized second dopant species is directed onto the hardmask layer and the exposed portion of the substrate to implant the exposed portion of the substrate with the second dopant species.

2. The method of claim 1, wherein the substrate includes an n-drift layer and a silicon nitride layer disposed atop the n-drift layer.

3. The method of claim 1, wherein the pattern includes a trench.

4. The method of claim 1, wherein the etching process includes a reactive-ion etching process wherein an ion beam formed of reactive plasma ions is directed onto the photoresist layer and the exposed portion of the hardmask layer.

5. The method of claim 1, wherein the etching process includes a wet etching process.

6. The method of claim 5, wherein the etching process includes a hydrofluoric acid etching process.

7. The method of claim 1, wherein the first dopant species is selected from carbon, boron, oxygen, nitrogen, phosphorous, and fluorine.

8. The method of claim 1, wherein the first ion implantation process is performed at room temperature.

9. The method of claim 1, wherein the photoresist layer has a thickness in a range of 1 um to 3 um.

10. The method of claim 1, wherein the hardmask layer has a thickness in a range of 0.5 um to 3 um.

11. The method of claim 1, wherein the hardmask is formed of one of silicon dioxide and amorphous carbon.

12. The method of claim 1, wherein the high energy, hot, second ion implantation process is performed at an energy of 1000 KeV or more and at a temperature of 500° Celsius or more.

13. The method of claim 1, wherein, during the etching process, the photoresist layer is preserved or is minimally etched relative to the hardmask layer.

14. A method for performing an ion implantation process, comprising:

providing a substrate to be implanted, the substrate including an n-drift layer and a silicon nitride layer disposed atop the n-drift layer;

providing a hardmask layer disposed atop the substrate, the hardmask layer having a thickness in a range of 0.5 um to 3 um;

providing a photoresist layer disposed atop the hardmask layer, the photoresist layer defining a trench exposing a portion of the hardmask layer, the photoresist layer having a thickness in a range of 1 um to 3 um;

performing a first ion implantation process wherein an ion beam formed of an ionized first dopant species is directed onto the photoresist layer and the exposed portion of the hardmask layer, the first dopant species selected to make the exposed portion of the hardmask layer more susceptible to etching;

performing at least one of an ion etching process and a wet etching process wherein the exposed portion of the hardmask layer is etched away to expose an underlying portion of the substrate; and performing a high energy, hot, second ion implantation process wherein the photoresist layer is removed, and wherein an ion beam formed of a ionized second dopant species is directed onto the hardmask layer and the exposed portion of the substrate to implant the exposed portion of the substrate with the second dopant species.

15. The method of claim 14, wherein the etching process includes a reactive-ion etching process wherein an ion beam formed of reactive plasma ions is directed onto the photoresist layer and the exposed portion of the hardmask layer.

16. The method of claim 14, wherein the etching process includes a hydrofluoric acid etching process.

17. The method of claim 14, wherein the first dopant species is selected from carbon, boron, oxygen, nitrogen, phosphorous, and fluorine.

18. The method of claim 14, wherein the first ion implantation process is performed at room temperature.

19. The method of claim 14, wherein the hardmask is formed of one of silicon dioxide and amorphous carbon.

20. The method of claim 14, wherein the high energy, hot, second ion implantation process is performed at an energy of 1000 KeV or more and at a temperature of 500° Celsius or more.

* * * * *